United States Patent
Shih et al.

(10) Patent No.: US 8,871,568 B2
(45) Date of Patent: Oct. 28, 2014

(54) PACKAGES AND METHOD OF FORMING THE SAME

(75) Inventors: Ying-Ching Shih, Taipei (TW); Szu Wei Lu, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/345,485

(22) Filed: Jan. 6, 2012

(65) Prior Publication Data

US 2013/0175694 A1 Jul. 11, 2013

(51) Int. Cl.
- *H01L 21/58* (2006.01)
- *H01L 23/485* (2006.01)
- *H01L 21/78* (2006.01)

(52) U.S. Cl.
USPC ........... 438/108; 438/106; 438/126; 438/113; 257/773; 257/E21.599; 257/E23.019; 257/E21.505

(58) Field of Classification Search
USPC .......................................... 438/113, 106–109
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,492,196 B1 * | 12/2002 | Chen | 438/106 |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,660,564 B2 * | 12/2003 | Brady | 438/119 |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |

(Continued)

*Primary Examiner* — Tom Thomas
*Assistant Examiner* — John Bodnar
(74) *Attorney, Agent, or Firm* — Slater & Matsil, L.L.P.

(57) ABSTRACT

A method includes forming a dielectric layer over a substrate, forming an interconnect structure over the dielectric layer, and bonding a die to the interconnect structure. The substrate is then removed, and the dielectric layer is patterned. Connectors are formed at a surface of the dielectric layer, wherein the connectors are electrically coupled to the die.

19 Claims, 8 Drawing Sheets

(56) References Cited

U.S. PATENT DOCUMENTS

| | | |
|---|---|---|
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2009/0072411 A1* | 3/2009 | Tews et al. .......... 257/776 |
| 2011/0171780 A1* | 7/2011 | Kado et al. .......... 438/113 |
| 2011/0186973 A1* | 8/2011 | Pagaila .......... 257/660 |

* cited by examiner

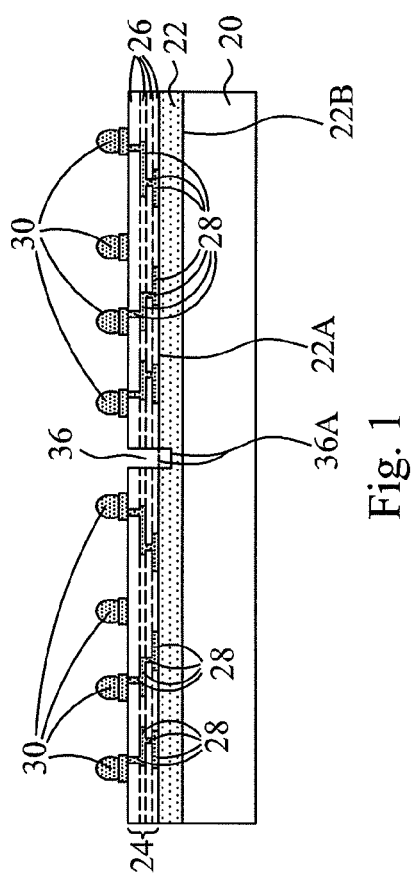
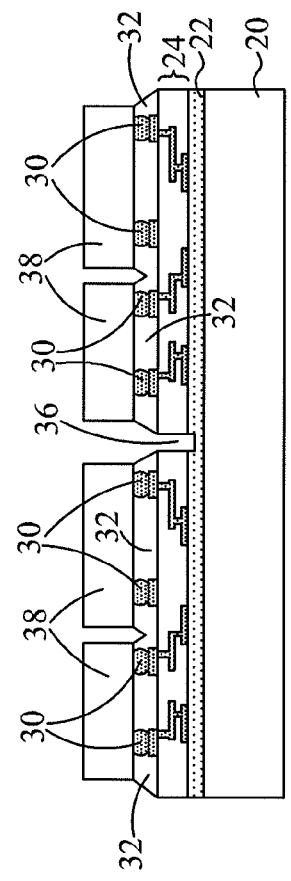

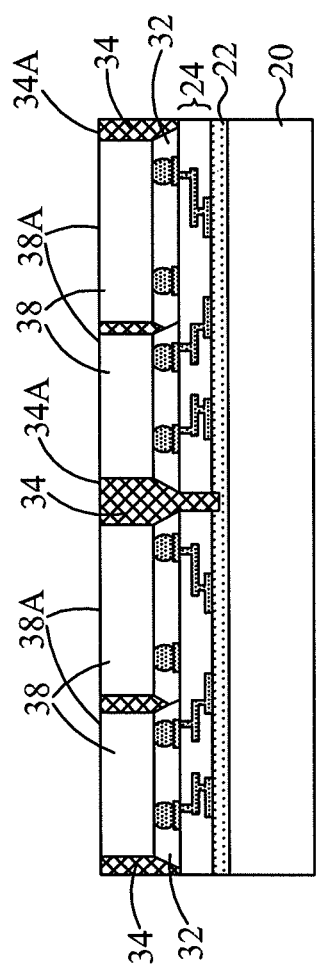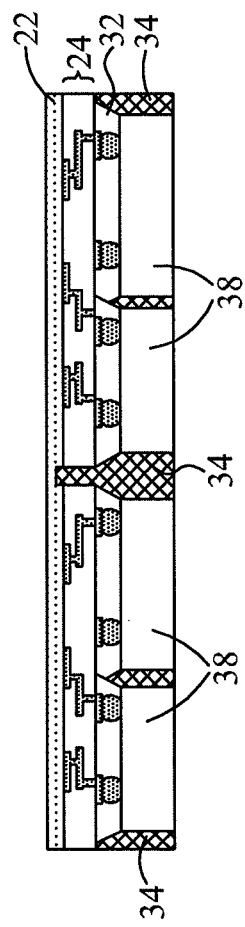
Fig. 3
Fig. 4

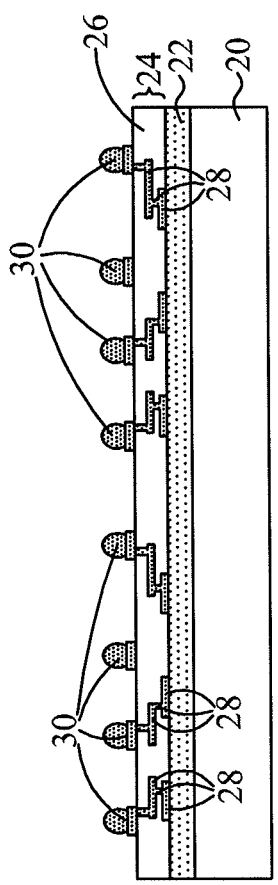
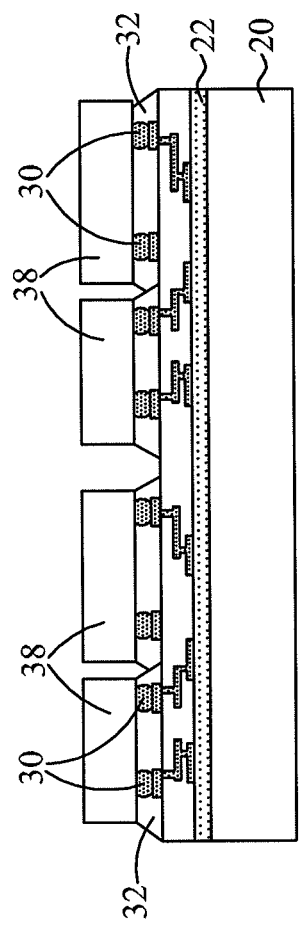
Fig. 8
Fig. 9

PACKAGES AND METHOD OF FORMING THE SAME

BACKGROUND

Three-Dimensional Integrated Circuits (3DICs) are commonly used to break the barriers of Two-Dimensional (2D) circuits. In 3DICs, two or more package components are stacked, wherein the package components include device dies that comprise Through-Substrate Vias (TSVs), interposers, package substrates, and the like.

Among the existing package components are interposers. An interposer includes a substrate, and TSVs formed in a substrate. Connectors are formed on both sides of the substrate, and are interconnected through the TSVs. The interposers are used for interconnection purposes, and do not include active devices therein.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 7 are cross-sectional views of intermediate stages in the manufacturing of a package in accordance with some exemplary embodiments; and FIGS. 8 through 14 are cross-sectional views of intermediate stages in the manufacturing of a package in accordance with some exemplary embodiments.

DETAILED DESCRIPTION OF ILLUSTRATIVE EMBODIMENTS

Figure 5:
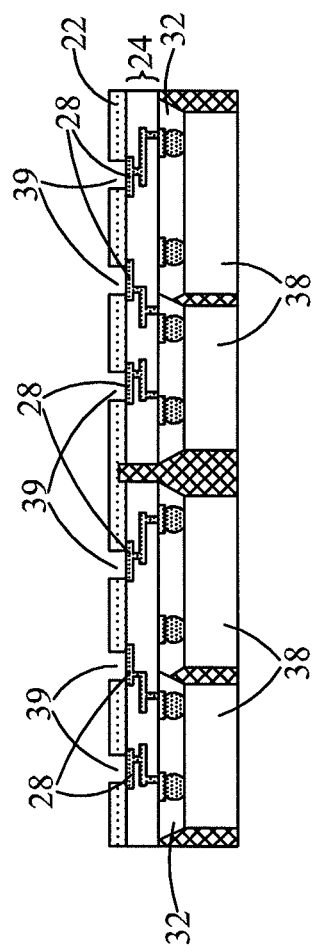

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Three-Dimensional Integrated Circuit (3DIC) package and the method of forming the same are provided. The intermediate stages of manufacturing the package in accordance with some embodiments are illustrated. The variations of the embodiments are discussed. Throughout the various views and illustrative embodiments, like reference numbers are used to designate like elements.

FIGS. 1 through 7 illustrate the cross-sectional views of intermediate stages in the manufacturing of a package in accordance with some exemplary embodiments. FIG. 1 illustrates substrate 20 and dielectric layer 22 formed on substrate 20. Substrate 20 may be a blank substrate with no conductive features formed therein. In an embodiment, substrate 20 is a silicon substrate, which may further be a blank silicon wafer. In alternative embodiments, substrate 20 may be formed of other materials such as glass, an organic material, or the like. Dielectric layer 22 may be formed of nitrides such as silicon nitride, oxides such as silicon oxide, silicon oxynitride, silicon carbide, combinations thereof, and multi-layers therein. It is realized, however, that the dimensions recited throughout the description are examples, and may be changed to different values. In some exemplary embodiments, the formation of dielectric layer 22 comprises a thermal oxidation of substrate 20, so that dielectric layer 22 comprises a thermal oxide. Alternatively, the formation methods of dielectric layer 22 include Chemical Vapor Deposition (CVD) methods such as Plasma Enhanced Chemical Vapor Deposition (PECVD), or the like.

Interconnect structure 24 is formed over, and may contact, dielectric layer 22. Interconnect structure 24 includes dielectric layer(s) 26, and Redistribution Lines (RDLs) 28 in dielectric layers 26. The bottom surface of a bottom one of dielectric layers 26 may be in contact with the top surface of dielectric layer 22. In some embodiments, dielectric layers 26 comprise silicon nitride, silicon oxide, phosphosilicate glass (PSG), borosilicate glass (BSG), boron-doped phosphosilicate glass (BPSG), or other inorganic dielectric materials. In other embodiments, dielectric layers 26 comprise low-k dielectric materials such as carbon-containing and/or nitrogen-containing low-k dielectric materials. Dielectric layers 26 may be free from organic materials. RDLs 28 may be formed of copper, aluminum, aluminum copper, tungsten, silver, and alloys thereof. The bottom layer of RDLs 28 may include narrow portions and wider portions, wherein the wide portions, which may be in contact with dielectric layer 22, may act as bond pads in subsequent bonding processes.

In accordance with some exemplary embodiments, since substrate 20 may be a silicon substrate, the back-end processes that are usable on silicon substrates may be used. For example, the formation of RDLs 28 and dielectric layers 26 may include damascene processes such as single damascene processes and/or dual damascene processes. An exemplary damascene process includes forming one of dielectric layers 26, forming openings in dielectric layer 26, filling a metallic material in the openings, and performing a Chemical Mechanical Polish (CMP) to remove excess metallic material over dielectric layer 26. The remaining portions of the metallic material in the openings thus form RDLs 28, which include metal lines and vias. The metallic material that is used in the damascene processes may be formed of substantially pure copper or a copper alloy. In the embodiments wherein dielectric layers 26 comprise low-k dielectric materials, a barrier layer (not shown) such as a titanium layer, a tantalum layer, a titanium nitride layer, and a tantalum oxide layer may be formed before the filling of the metallic material.

With the use of silicon back-end processes such as the damascene processes, the dimensions of dielectric layers 26 and the dimensions of RDLs 28 may be significantly reduced compared to the respective dimensions of organic dielectric layers and the dimensions of the RDLs formed on the organic dielectric layers.

Front-side connectors 30 are formed on the surface of interconnect structure 24, and are electrically coupled to RDLs 28. In an embodiment, connectors 30 comprise solder balls. In alternative embodiments, connectors 30 comprise metal pillars, or metal pillars with solder caps formed on the metal pillars.

After the formation of interconnect structure 24, and before or after the formation of connectors 30, a pre-cut may be performed to cut through interconnect structure 24. As a result, trenches 36 are formed, and extend from a top surface of interconnect structure 24 into interconnect structure 24. In some embodiments, bottom 36A (illustrated by a dashed line) of trench 36 is substantially level with top surface 22A of dielectric layer 22. In alternative embodiments, bottom 36A of trench 36 may be at an intermediate level between top surface 22A and bottom surface 22B of dielectric layer 22. In yet other embodiments, dielectric layer 22 may be substantially cut through in the pre-cut step, and bottom 36A of trench 36 may be substantially level with bottom surface 22B of dielectric layer 22. In yet alternative embodiments, trench 36 extends into substrate 20. The precut may be performed using laser or a blade.

Referring to FIG. 2, package components 38 are bonded to the top surface of interconnect structure 24 through connectors 32. In some embodiments, package components 38 are dies, and hence are referred to as dies 38 hereinafter. Dies 38 may be device dies comprising integrated circuit devices (not shown), such as transistors, capacitors, inductors, resistors, and the like, therein. The bonding between dies 38 and connectors 30 may be a solder bonding or a direct metal-to-metal (such as a copper-to-copper) bonding. Underfill 32 is dispensed into the gaps between dies 38 and interconnect structure 24, and is cured.

Referring to FIG. 3, polymer 34 is molded onto dies 38 and interconnects structure 24. In an embodiment, polymer 34 comprises a molding compound, and hence is referred to as molding compound 34 hereinafter, although it may also be formed of other types of polymers such as epoxy, molding underfill, or the like. Molding compound 34 is further filled into the gaps between dies 38, and filled into trench 36. After the curing of molding compound 34, a grinding step may be performed on molding compound 34 to level the top surface of molding compound 34. As a result, top surface 34A of molding compound 34 may be higher than or level with top surfaces 38A of dies 38.

In alternative embodiments, instead of applying underfill 32 and molding compound 34 in separate steps, wherein each of the dispensing of underfill 32 and the dispensing of molding compound 34 is accompanied by a curing process, a molding underfill is used to replace underfill 32 and molding compound 34, and is referred to as molding underfill 32/34 hereinafter. Accordingly, the molding underfill fills the gaps between dies 38 and interconnect structure 24, and also fills the gaps between dies 38. After the dispensing of molding underfill 32/34, a curing step is performed.

Referring to FIG. 4, the package in FIG. 3 is flipped upside down. Substrate 20 is then removed. To accurately control the removal of substrate 20, a grinding step may be performed to remove the most of substrate 20, while a thin layer of substrate 20 remains. An etching step is then performed to remove the remaining substrate 20. In the resulting structure as shown in FIG. 4, dielectric layer 22 is exposed.

Figure 6:
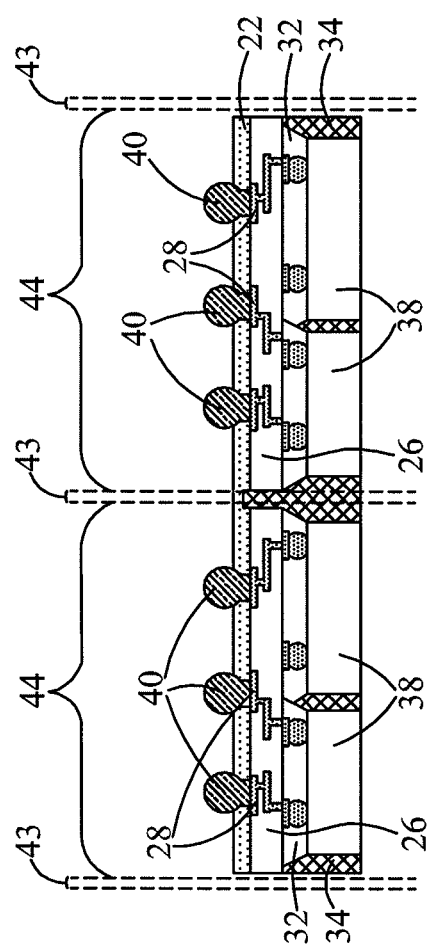

FIGS. 5 and 6 illustrate the formation of connectors 40. Referring to FIG. 5, dielectric layer 22 is patterned to expose the metal pads in RDLs 28. Next, as shown in FIG. 6, connectors 40 are formed. In some exemplary embodiments, the formation of connectors 40 may include placing solder balls on the exposed portions of RDLs 28, and then reflowing the solder balls. In alternative embodiments, the formation of connectors 40 includes performing a plating step to form solder regions on the exposed portions of RDLs 28, and then reflowing the solder regions. Connectors 40 may also comprise metal pillars, or metal pillars and solder caps, which may also be formed through plating.

After the formation of connectors 40, a die-saw may be performed, so that packages 44 are formed. Each of packages 44 includes a portion of interconnect structure 24, and die(s) 38 bonded thereon. Kerfs 43 of the die-saw may be narrower than trench 36 (please refer to FIG. 1). As a result, portions of molding compound 34 are left on the opposite sides of kerfs 43. Dielectric layers 26 in interconnect structure 24 are thus protected by the remaining portions of molding compound 34, which remaining portions cover the sidewalls of dielectric layers 26.

Figure 7:
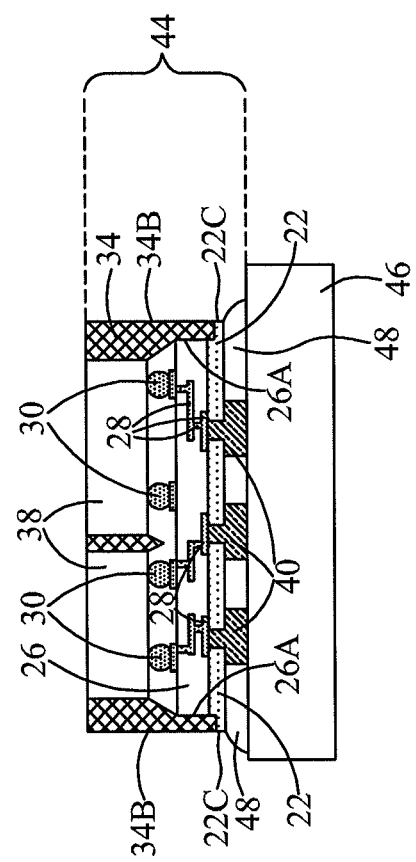

FIG. 7 illustrates the bonding of package 44 onto package component 46. In some embodiments, package component 46 comprises a package substrate, a Printed Circuit Board (PCB), or the like. Connectors 40 may electrically couple dies 38 to the conductive features (not shown) in package component 46. Underfill 48 may be applied to the gap between package 44 and package component 46.

In the resulting structure in FIG. 7, molding compound 34 may cover sidewalls of interconnect structure 24, which may also be the sidewalls of dielectric layers 26. In some embodiments, edges 22C of dielectric layer 22 may be aligned to edges 34B of molding compound 34. Edges 26A of dielectric layers 26 may be misaligned with the respective edges 34B of molding compound 34 and edges 22C of dielectric layer 22. Furthermore, between connectors 30 and connectors 40, there may be no substrate (including semiconductor substrate), and hence no through-substrate vias.

FIGS. 8 through 14 illustrate cross-sectional views of intermediate stages in the formation of a package in accordance with some exemplary embodiments. Unless specified otherwise, the materials and formation methods of the components in these embodiments are essentially the same as the like components, which are denoted by like reference numerals in the embodiment shown in FIGS. 1 through 7. The formation details of the embodiments shown in FIGS. 8 through 14 may thus be found in the discussion of the exemplary embodiments shown in FIGS. 1 through 7.

The embodiments in FIGS. 8 through 14 are similar to the embodiments in FIGS. 1 through 7, except that no pre-cut is performed to form trenches in interconnect structure 24. A brief discussion of these embodiments is provided below.

Referring to FIG. 8, dielectric layer 22 is formed on substrate 20, followed by the formation of interconnect structure 24. Interconnect structure 24 includes RDLs 28 formed in dielectric layers 26. After the formation of interconnect structure 24, no pre-cut is performed to cut interconnect structure 24. Referring to FIG. 9, dies 38 are bonded to interconnect structure 24 through connectors 30. Since no pre-cut is performed, as shown in FIG. 10, after molding compound 34 is applied, molding compound 34 does not extend into interconnect structure 24.

Figure 10:
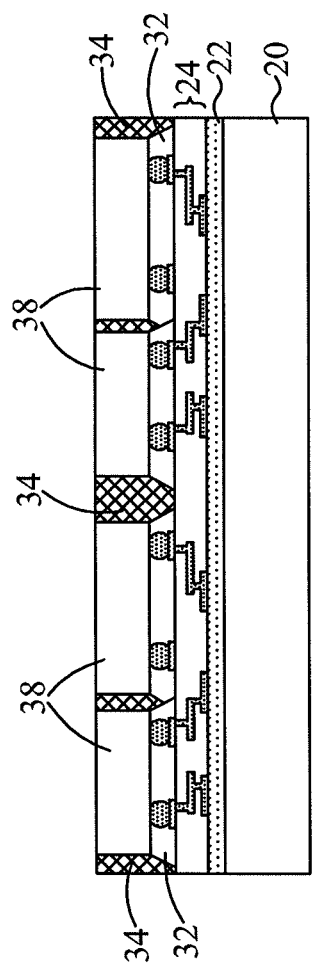
Figure 11:
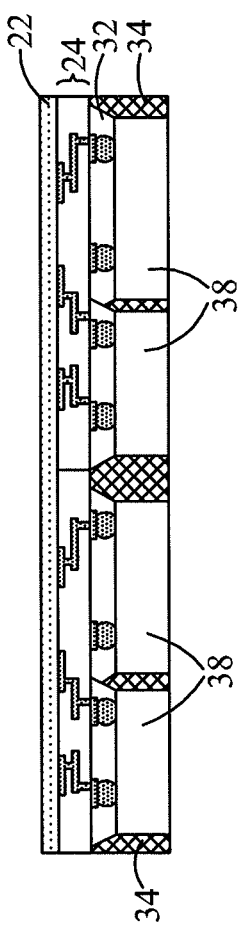
Figure 12:
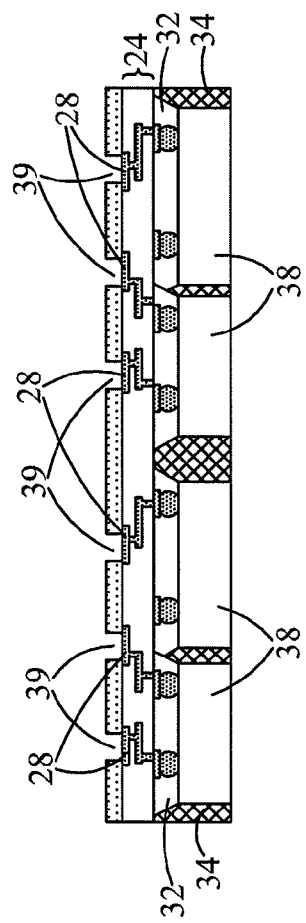
Figure 13:
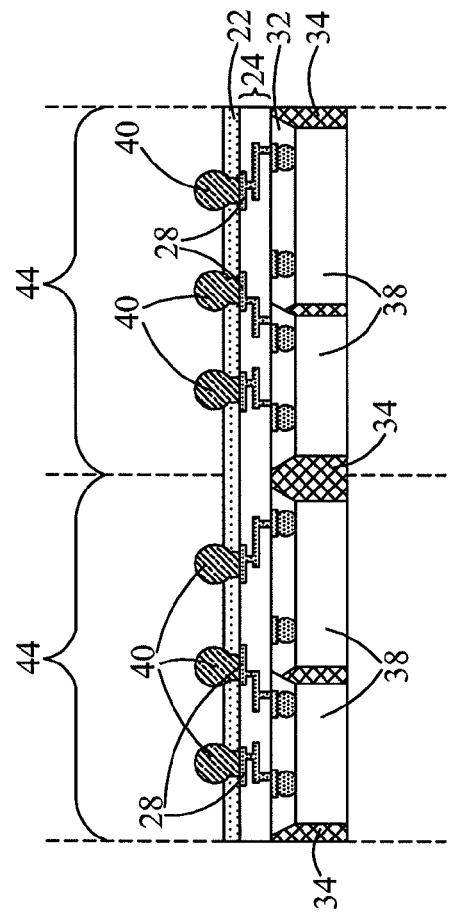

Substrate 20 as in FIG. 10 is then removed, for example, by grinding and etching. The resulting structure is shown FIG. 11, in which dielectric layer 22 is exposed. Dielectric layer 22 is then patterned, as shown in FIG. 12, so that portions of RDLs 28 are exposed. Next, as shown in FIG. 13, connectors 40 are formed. The structure shown in FIG. 13 is then sawed into packages 44. In some embodiments wherein dielectric layers 26 comprise low-k dielectric layers, the die-saw is performed using laser to avoid the damage to the low-k dielectric materials. In alternative embodiments, either the laser or a blade may be used.

Figure 14:
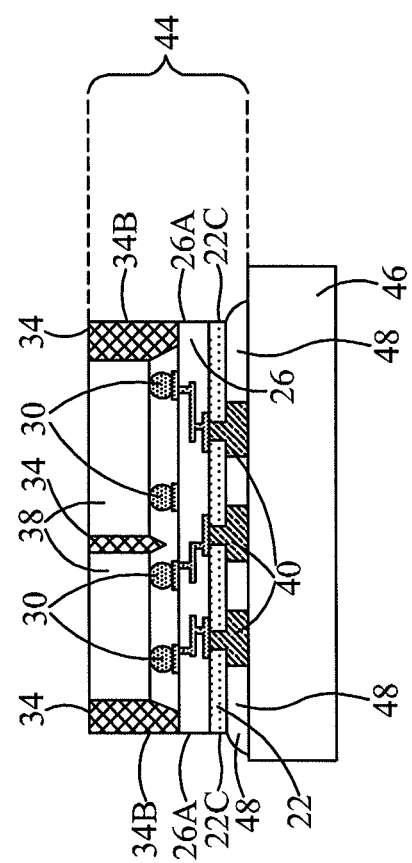

In FIG. 14, the resulting package 44 is further bonded on package component 46, followed by the application and the curing of underfill 48. In the resulting structure, molding compound 34 has edges 34B that are aligned to edges 26A of dielectric layers 26 and the edges 22C of dielectric layer 22. Dielectric layers 22 and 26 may be formed of inorganic materials in accordance with some embodiments. Furthermore, between connectors 30 and connectors 40, there may be no substrate (including semiconductor substrate), and no through-substrate vias.

In accordance with embodiments, as shown in FIGS. 7 and 14, the substrate on which the interconnect structure is formed is removed. Accordingly, no through-vias need to be formed. As a result, the electrical paths are shortened compared to the packages comprising substrates and through-vias in the substrates. On the other hand, although the substrate is removed, in the formation of the packages, silicon back-end processes may be used. The dimensions of the interconnect structures are thus reduced.

In accordance with embodiments, a method includes forming a dielectric layer over a substrate, forming an interconnect structure over the dielectric layer, and bonding a die to the interconnect structure. The substrate is then removed, and the dielectric layer is patterned. Connectors are formed at a surface of the dielectric layer, wherein the connectors are electrically coupled to the die.

In accordance with other embodiments, a method includes forming a dielectric layer on a substrate, and forming an interconnect structure over the dielectric layer. The interconnect structure includes at least one dielectric layer, and redistribution lines in the at least one dielectric layer. A plurality of dies is bonded to the interconnect structure. The plurality of the dies is molded with a polymer, wherein the polymer is filled into gaps between the plurality of dies. The substrate is grinded to expose the dielectric layer. After the step of grinding, the dielectric layer is patterned. Connectors are formed at a surface of the dielectric layer, wherein the connectors are electrically coupled to the redistribution lines.

In accordance with yet other embodiments, a device includes an interconnect structure, which further includes a dielectric layer, and a plurality of dielectric layers adjoining the dielectric layer, wherein none of the plurality of dielectric layers is formed of an organic material. The device further includes a plurality of redistribution lines disposed in the plurality of dielectric layers, a first plurality of connectors on a first side of the interconnect structure, wherein the first plurality of connectors is in contact with the dielectric layer, and a second plurality of connectors on a second side of the interconnect structure and electrically coupled to the first plurality of connectors. The first and the second sides are opposite sides. No substrate and through-vias are formed between the first and the second connectors. A package component is bonded to the second plurality of connectors. A polymer molds the package component therein.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
forming a first dielectric layer over a substrate;
forming an interconnect structure over the first dielectric layer, wherein the interconnect structure comprises redistribution lines in at least one second dielectric layer;
bonding a die to the interconnect structure;
performing a pre-cut on the interconnect structure to form a trench, wherein the trench extends into the interconnect structure;
after the performing the pre-cut, molding a polymer on the die, wherein the polymer is in contact with edges of the die;
removing the substrate to reveal the first dielectric layer;
after the removing the substrate, patterning the first dielectric layer; and
forming connectors at a surface of the first dielectric layer, wherein the connectors are electrically coupled to the die.

2. The method of claim 1, wherein the substrate comprises a silicon substrate.

3. The method of claim 1, wherein a bottom of the trench is substantially level with a top surface of the first dielectric layer, and wherein the top surface of the first dielectric layer is in contact with the interconnect structure.

4. The method of claim 1, wherein a bottom of the trench extends into the first dielectric layer.

5. The method of claim 1, wherein the first dielectric layer comprises a material selected from the group consisting essentially of silicon nitride, silicon oxide, and combinations thereof.

6. A method comprising:
forming a first dielectric layer on a substrate;
forming an interconnect structure over the first dielectric layer, wherein the interconnect structure comprises:
at least one second dielectric layer; and
redistribution lines in the at least one second dielectric layer;
bonding a plurality of dies to the interconnect structure, wherein the plurality of dies have gaps therebetween;
performing a pre-cut on the interconnect structure to form a trench in the interconnect structure;
after the performing the pre-cut, molding the plurality of dies with a polymer, wherein the polymer is filled into the gaps between the plurality of dies;
grinding the substrate to expose the first dielectric layer;
after the step of grinding, patterning the first dielectric layer; and
forming connectors at a surface of the first dielectric layer, wherein the connectors are electrically coupled to the redistribution lines.

7. The method of claim 6, wherein the substrate is a silicon substrate.

8. The method of claim 6, wherein the step of forming the interconnect structure comprises damascene processes.

9. The method of claim 6, wherein a bottom of the trench is substantially level with a top surface of the first dielectric layer, and wherein the top surface of the first dielectric layer is in contact with the interconnect structure.

10. The method of claim 6, wherein a bottom the trench extends into the first dielectric layer.

11. The method of claim 6 further comprising a die-saw step to separate the interconnect structure and the plurality of dies into a plurality of packages, and wherein in each of the plurality of packages, a remaining portion of the polymer is on a side edge of the interconnect structure.

12. The method of claim 1, wherein openings are formed in the first dielectric layer by the step of patterning the first dielectric layer, wherein the interconnect structure comprises conductive features, wherein the conductive features in the interconnect structure are exposed to outside environments through the openings, and wherein the connectors are electrically coupled to the die through the openings.

13. The method of claim 6, wherein openings are formed in the first dielectric layer by the step of patterning the first dielectric layer, wherein the redistribution lines in the interconnect structure are exposed to external environments through the openings, and wherein the connectors are electrically coupled to the redistribution lines through the openings.

14. The method of claim 1, wherein the polymer is filled into the trench.

15. The method of claim 1, wherein the connectors comprises solder regions.

16. The method of claim 15, wherein the solder regions extend into the first dielectric layer.

17. The method of claim 6, wherein the connectors comprises solder regions, and wherein the solder regions extend into the first dielectric layer.

18. A method comprising:
   forming an interconnect structure over a first dielectric layer, wherein the first dielectric layer is over a substrate, and wherein the interconnect structure comprises:
      at least one second dielectric layer; and
      redistribution lines in the at least one second dielectric layer;
   bonding a die to the interconnect structure;
   performing a pre-cut on the interconnect structure to form a trench in the interconnect structure, wherein the trench has a bottom at an intermediate level of the first dielectric layer, and wherein the intermediate level is between a top surface and a bottom surface of the first dielectric layer;
   after the performing the pre-cut, molding the die with a polymer, wherein the polymer is filled into the trench, and wherein the polymer encircles the die;
   removing the substrate to expose the first dielectric layer;
   after the removing the substrate, patterning the first dielectric layer to form openings; and
   forming solder regions extending into the openings in the first dielectric layer.

19. The method of claim 18, wherein the substrate comprises a silicon substrate, and the first dielectric layer comprises silicon oxide.

* * * * *